(12) United States Patent
Reynolds

(10) Patent No.: US 6,826,642 B1
(45) Date of Patent: Nov. 30, 2004

(54) METHOD AND APPARATUS FOR THE USE OF DISCRIMINATORS FOR PRIORITY ARBITRATION

(75) Inventor: Grahame K. Reynolds, Southampton (GB)

(73) Assignee: Cypress Semiconductor Corp., San Jose, CA (US)

( * ) Notice: Subject to any disclaimer, the term of this patent is extended or adjusted under 35 U.S.C. 154(b) by 476 days.

(21) Appl. No.: 09/877,659

(22) Filed: Jun. 7, 2001

(51) Int. Cl.[7] .............................................. G06F 12/00
(52) U.S. Cl. ..................... 710/240; 710/242; 326/94; 327/198
(58) Field of Search ................. 710/240–244; 326/94; 327/1, 3, 19, 43, 63, 64, 142, 198, 219, 225; 361/86, 187

(56) References Cited

U.S. PATENT DOCUMENTS

| | | | | |
|---|---|---|---|---|
| 3,444,470 A | * | 5/1969 | Bolt et al. ...................... | 327/19 |
| 4,093,878 A | * | 6/1978 | Paschal et al. ............... | 327/198 |
| 4,225,795 A | * | 9/1980 | Keeney ........................ | 327/43 |
| 4,282,489 A | * | 8/1981 | DeRienzo ................... | 327/198 |
| 4,841,178 A | * | 6/1989 | Bisson ......................... | 327/19 |
| 4,998,027 A | * | 3/1991 | Mihara et al. ................ | 327/19 |
| 5,081,377 A | | 1/1992 | Freyman | |
| 5,489,865 A | | 2/1996 | Colvin, Sr. | |
| 5,638,015 A | | 6/1997 | Gujral et al. | |
| 5,754,070 A | | 5/1998 | Baumann et al. | |
| 5,789,945 A | | 8/1998 | Cline | |
| 6,072,346 A | | 6/2000 | Ghahremani | |
| 6,111,436 A | | 8/2000 | Molnar | |
| 6,184,701 B1 | | 2/2001 | Kim et al. | |
| 6,498,513 B1 | | 12/2002 | Reynolds | |
| 6,515,517 B1 | | 2/2003 | Reynolds | |

* cited by examiner

*Primary Examiner*—Khanh Dang
(74) *Attorney, Agent, or Firm*—Christopher P. Maiorana, P.C.

(57) ABSTRACT

An apparatus comprising a margin logic circuit, one or more discriminator circuits and a sense circuit. The margin logic circuit may be configured to receive a plurality of requests and present one or more control signals. The one or more discriminators may be configured to (i) present one or more leading access signals and (ii) receive the one or more control signals and the plurality of requests. The sense circuit may be configured to receive the one or more leading access signals and the plurality of requests and present grant access signal. The sense circuit may be configured to reduce the effects of metastable conditions.

22 Claims, 7 Drawing Sheets

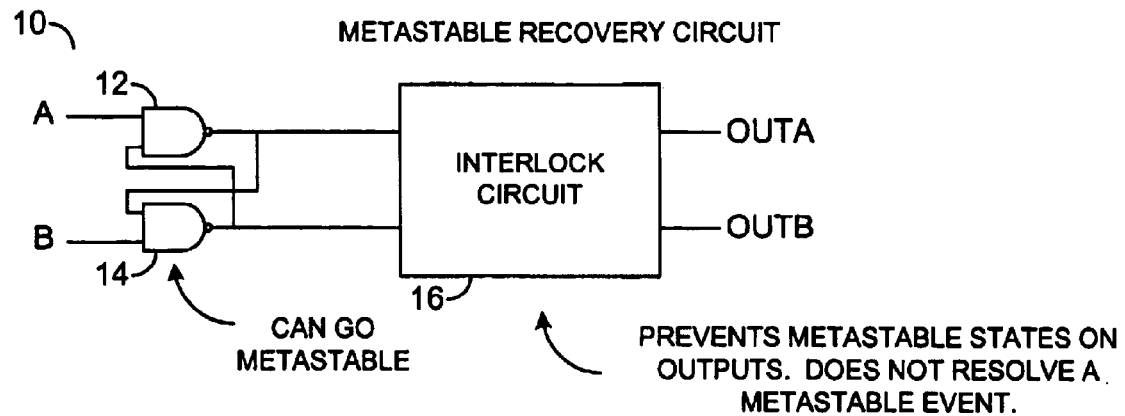
(CONVENTIONAL)
FIG. 1
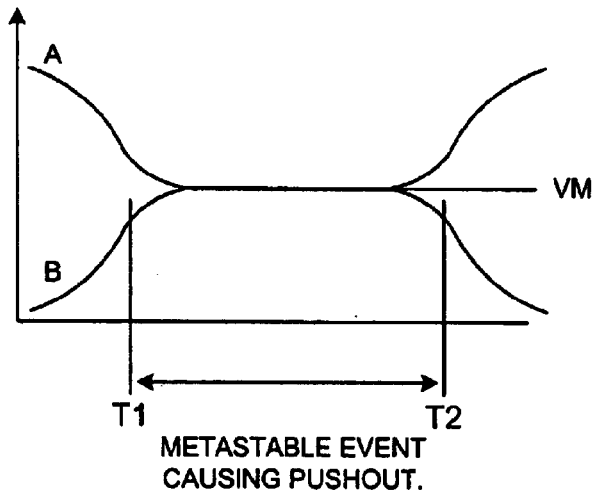
(CONVENTIONAL)
FIG. 2

METHOD AND APPARATUS FOR THE USE OF DISCRIMINATORS FOR PRIORITY ARBITRATION

CROSS REFERENCE TO RELATED APPLICATIONS

The present application relates to co-pending U.S. Pat. No. 6,498,513 filed Mar. 26, 2001, U.S. Pat. No. 6,674,306 filed Mar. 26, 2001, and and U.S. Pat. No. 6,515,517 filed Mar. 26, 2001, which are hereby incorporated by reference in their entirety.

FIELD OF THE INVENTION

The present invention relates to a method and/or architecture for implementing a discriminator circuit generally and, more particularly, to a metastable insensitive circuit configured to arbitrate between requests based on pulse discriminators.

BACKGROUND OF THE INVENTION

Hardware devices are employed within computer systems to assist in determining the availability of computer resources (i.e., a memory chip, a hard disk drive, etc.) which can only be controlled and accessed by one requesting device at a time. However, metastable conditions can exist when contention between requests from different devices occurs. Arbitrators (or arbiters) have been designed to reduce bus contention through flags (or other such means). However, arbitrators can enter metastable states during simultaneous requests. Conventional arbitrators can therefore enter an undecided state and remain for an indefinite period of time, causing undesirable results (i.e., a system crash or hang, etc.).

Referring to FIG. 1, a circuit 10 is shown illustrating a conventional arbitration circuit. The circuit 10 comprises a NAND gate 12, a NAND gate 14 and an interlock circuit 16. The NAND gate 12 receives the signal A and an output from the NAND gate 14. The NAND gate 14 receives a signal B and an output from the NAND gate 12. The interlock circuit 16 presents a signal OUTA and a signal OUTB in response to the signal from the NAND gates 12 and 14. The NAND gates 12 and 14 are implemented in a cross-coupled configuration. Therefore, the NAND gates 12 and 14 can enter a metastable condition.

Referring to FIG. 2, a timing diagram of the circuit 10 is shown. The input A and the input B are shown crossing between a time T1 and a time T2. The period between the time T1 and T2 illustrates the metastable event which can cause a push out. The circuit 10 is subject to metastability when the inputs A and B change states simultaneously.

The interlock circuit 16 attempts to resolve metastable states, but does not prevent metastable events. The arbitration circuit 10 implements cross coupled NAND arbiters (12 and 14) which cause delays due to metastable events. The resolution (or recovery) time of the cross coupled arbiters 12 and 14 is not predictable. While the interlock circuit 16 can try to prevent metastable states from occurring on the outputs, the interlock circuit 16 does not resolve the occurrence of the metastable events. Conventional arbitrators attempt to reduce the probability of metastable occurrences rather than eliminate such occurrences.

It is desirable to provide a method and/or architecture that eliminates metastable conditions due to simultaneous requests.

SUMMARY OF THE INVENTION

One aspect of the present invention concerns an apparatus comprising a margin logic circuit, one or more discriminator circuits and a sense circuit. The margin logic circuit may be configured to receive a plurality of requests and present one or more control signals. The one or more discriminators may be configured to (i) present one or more leading access signals and (ii) receive the one or more control signals and the plurality of requests. The sense circuit may be configured to receive the one or more leading access signals and the plurality of requests and present grant access signal. The sense circuit may be configured to reduce the effects of metastable conditions.

Another aspect of the present invention concerns an apparatus comprising a first one or more threshold devices, a second one or more threshold devices and a logic device. The first one or more threshold devices may be configured to control an output. The second one or more threshold devices may be configured to receive the output. The logic device may be (i) coupled to the second one or more threshold devices and (ii) configured to provide a feedback to the first one or more threshold devices. The feedback may be configured to force a reset condition if a metastable event occurs.

The objects, features and advantages of the present invention include providing an arbitration circuit based on pulse discriminators that may (i) reduce the effects of metastable conditions, (ii) effect arbitration between two (or more) asynchronous requests, (iii) reduce delays associated with metastable events, and/or (iv) force a reset of a metastable condition.

BRIEF DESCRIPTION OF THE DRAWINGS

These and other objects, features and advantages of the present invention will be apparent from the following detailed description and the appended claims and drawings in which:

FIG. 1 is a block diagram of a conventional metastable recovery circuit;

FIG. 2 is a timing diagram of the conventional circuit of FIG. 1;

DETAILED DESCRIPTION OF THE PREFERRED EMBODIMENTS

Figure 3:
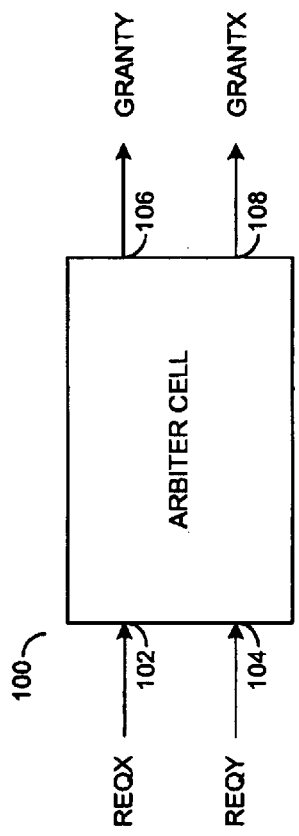
FIG. 3 is a block diagram of a preferred embodiment of the present invention.

Referring to FIG. 3, a block diagram of a circuit 100 is shown in accordance with a preferred embodiment of the present invention. The circuit 100 may be implemented as an arbitration circuit based on pulse discriminators. The circuit 100 may be implemented, for example, in applications where requests for data cannot be delayed. However, the circuit 100 may be implemented in other applications as well. The circuit 100 may be particularly useful in applications where an almost instantaneous decision may be required between two asynchronous requests. Since only one request is generally serviced at a time, one request is generally serviced and the other request may be required to wait. Additionally, the system 100 may be configured to service both requests or tasks within a predetermined time, such that the requests may be serviced in either order.

In a particular example, simultaneous requests in dual port memory applications may be received requiring access to the same memory space. The pair of accesses (or requests) should be serviced within a particular time (e.g., one clock cycle) before another pair of accesses are requested. Simultaneous requests may cause metastable states (e.g., a state with uncertain (or circumstantial stability) to occur). The circuit 100 may eliminate such occurrences (or potential danger) of metastable states. While metastability cannot be fully eliminated, knowledge of potential metastable occurrences may allow for an improved (e.g., metastable insensitive) design as provided by the circuit 100.

The circuit 100 will be described in the particular context of a dual port implementation. The circuit 100 may be implemented with any number of ports in order to meet the criteria of a particular implementation. The circuit 100 may have an input 102 that may receive a signal (e.g., REQX), an input 104 that may receive a signal (e.g., REQY), an output 106 that may present a signal (e.g., GRANTY) and an output 108 that may present a signal (e.g., GRANTX). In one example, the signals REQX and REQY may be implemented as request signals and the signals GRANTX and GRANTY may be implemented as bus grant signals.

Figure 4:
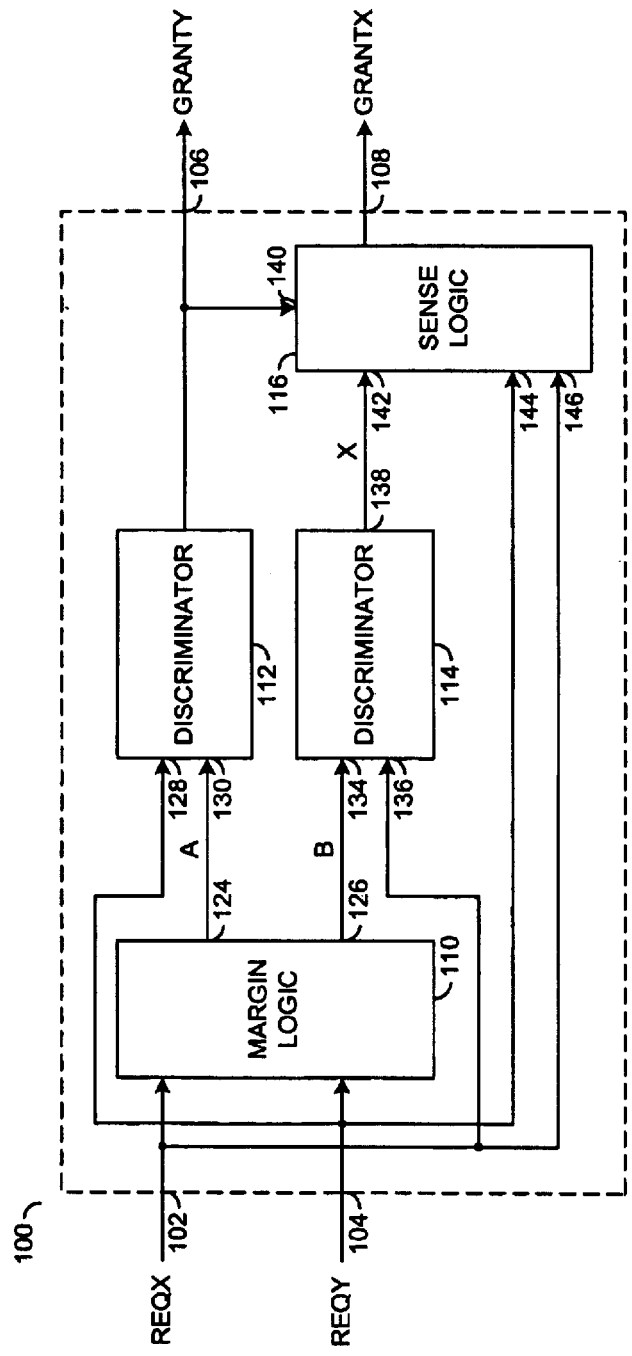
FIG. 4 is a detailed block diagram of the circuit of FIG. 3.

Referring to FIG. 4, a more detailed diagram of the circuit 100 is shown. The circuit 100 generally comprises a block (or circuit) 110, a block (or circuit) 112, a block (or circuit) 114 and a block (or circuit) 116. The circuit 110 may be implemented as a margin logic circuit. The circuit 112 may be implemented as a discriminator circuit. The circuit 114 may be implemented as a discriminator circuit. The circuit 116 may be implemented as a sense logic circuit.

The margin logic circuit 110 may receive the signal REQX and the signal REQY. The margin logic circuit 110 may have an output 124 that may present a signal (e.g., A) and an output 126 that may present a signal (e.g., B). The discriminator 112 may have an input 128 that may receive the signal REQY and an input 130 that may receive the signal A. The discriminator circuit 112 may generate the signal GRANTY. The discriminator 112 may present the signal GRANTY in response to the signal REQY and the signal A. The discriminator 114 may have an input 134 that may receive the signal B, an input 136 that may receive the signal REQX and an output 138 that may present a signal (e.g., X)

The sense logic circuit 116 may have an input 140 that may receive the signal GRANTY and an input 142 that may receive the signal X. The sense logic circuit 116 may also have an input 144 that may receive the signal REQX and an input 146 that may receive the signal REQY. The sense logic circuit 116 may generate the signal GRANTX. The sense logic circuit 116 may present the signal GRANTX in response to the signals GRANTY, X, REQX and/or REQY.

Figure 5:
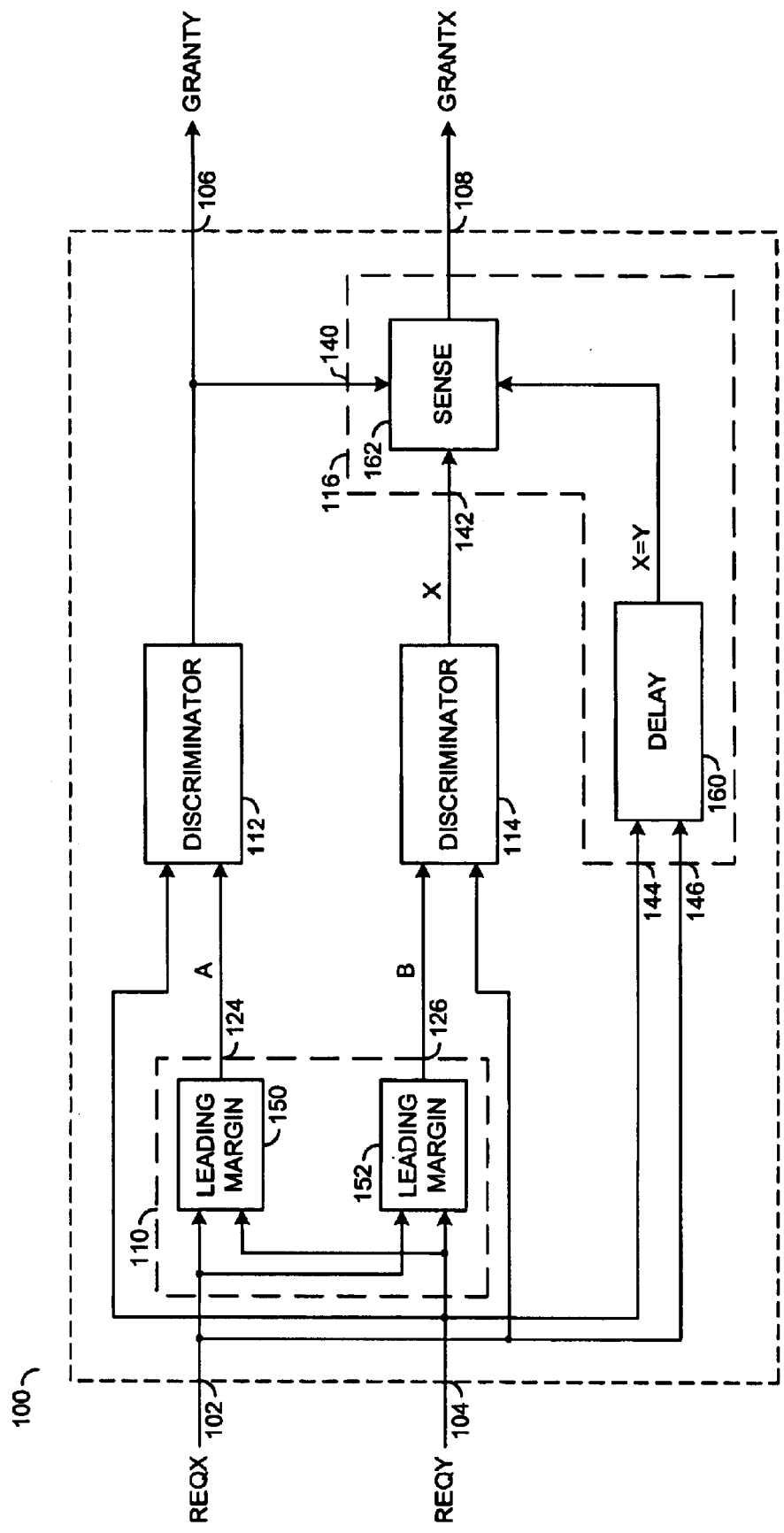
FIG. 5 is a more detailed block diagram of the circuit of FIGS. 3 and 4.

Referring to FIG. 5, a more detailed diagram of the circuit 100 is shown. The margin logic circuit 110 is shown in more detail as a block (or circuit) 150 and a block (or circuit) 152. The circuit 150 may be implemented as a leading margin circuit. The circuit 152 may also be implemented as a leading margin circuit. The circuits 150 and 152 may each receive the signals REQX and REQY and present the signal A and the signal B, respectively. The select logic circuit 116 generally comprises a block (or circuit) 160 and a block (or circuit) 162. The circuit 160 may be implemented as a delay circuit. The circuit 162 may be implemented as a sense circuit. The delay circuit 160 may receive the signals REQX and REQY and present a signal (e.g., X=Y). The sense circuit 162 may receive the signals GRANTY, X and X=Y and present the signal GRANTX. The sense circuit 162 may be configured to determine when (i) the signal REQX leads REQY, (ii) the signal REQY leads REQX, and/or (iii) when the signal REQX is in close proximity to the signal REQY.

Figure 6:
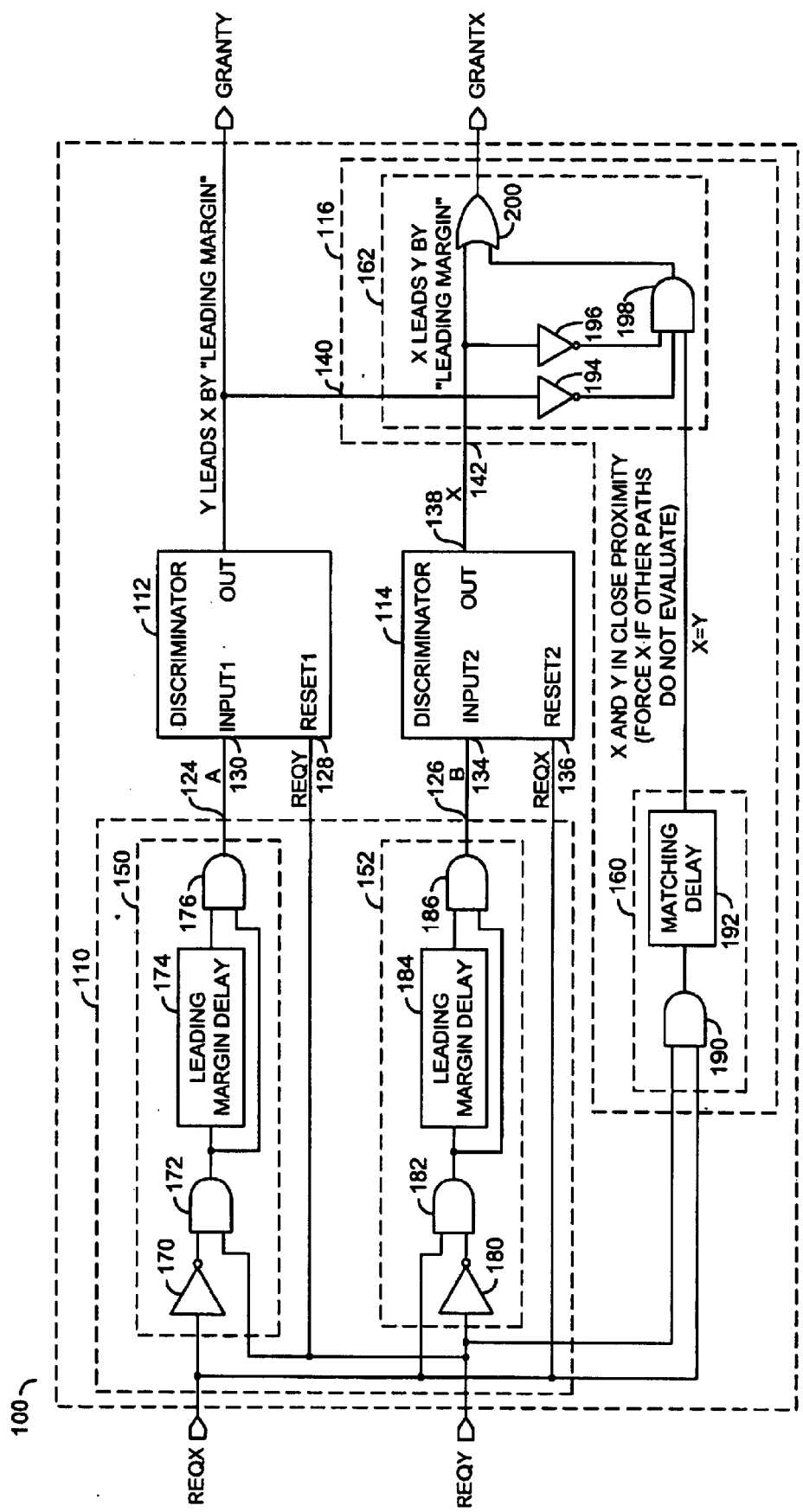
FIG. 6 is a more detailed block diagram of the circuit of FIGS. 3, 4 and 5.

Referring to FIG. 6, a more detailed diagram of the circuit 100 is shown. The circuit 150 is shown implemented as an inverter 170, a gate 172, a circuit 174 and a gate 176. The gates 172 and 176 may be implemented as AND gates. However, other gates may be implemented accordingly to meet the design criteria of a particular implementation. The circuit 152 may be implemented as an inverter 180, a gate 182, a circuit 184 and a gate 186. The gates 182 and 186 may be implemented as AND gates. However, other gates may be implemented accordingly to meet the design criteria of a particular implementation. The circuit 174 may be a delay circuit. The circuit 184 may be a delay circuit. In one example, the delay circuits 174 and 184 may be implemented as leading margin delay circuits. The leading margin delay circuits 174 and 184 may have a predetermined delay, in one example, of 50–150 ps, more preferably 75–125 ps, most preferably 100 ps. Optional delay devices (not shown) may be implemented within the device paths of the circuit 150 and/or 152. Moreover, the delay devices may be programmable.

The circuit 160 may be implemented as a gate 190 and the circuit 192. The circuit 192 may be implemented as a delay circuit. In one example, the circuit 142 may be implemented as a matching delay circuit. The delay circuit 192 may have a predetermined delay. The circuit 162 may be implemented as an inverter 194, an inverter 196, a gate 198 and a gate 200. The gate 198 may be implemented as an AND gate. The gate 200 may be implemented as an OR gate. An optional control signal (not shown) may be presented to the gate 198. The optional control signal may allow a user to select between forcing the request REQX and the request REQY. The particular type of the gates 198 and 200 may be varied accordingly to meet the design criteria of a particular implementation. For example, the inverters 194 and 196 may be implemented as inverter inputs to the gate 198.

The inverter 194 may receive the signal GRANTY. The signal GRANTY may indicate when the signal REQY leads the signal REQX by a leading margin. The inverter 196 and the gate 200 may receive the signal X. The signal X may indicate when the signal REQX leads the signal REQY by a leading margin. The gate 198 may receive an output of the inverter 194, an output of the inverter 196 and the signal X=Y. The signal X=Y may indicate when the signal REQX and the signal REQY are in close proximity. An output of the gate 198 may be presented to the gate 200. The gate 200 may present the signal GRANTX. The sense circuit 116 may force the signal GRANTX if the signal X=Y is active.

Figure 7:
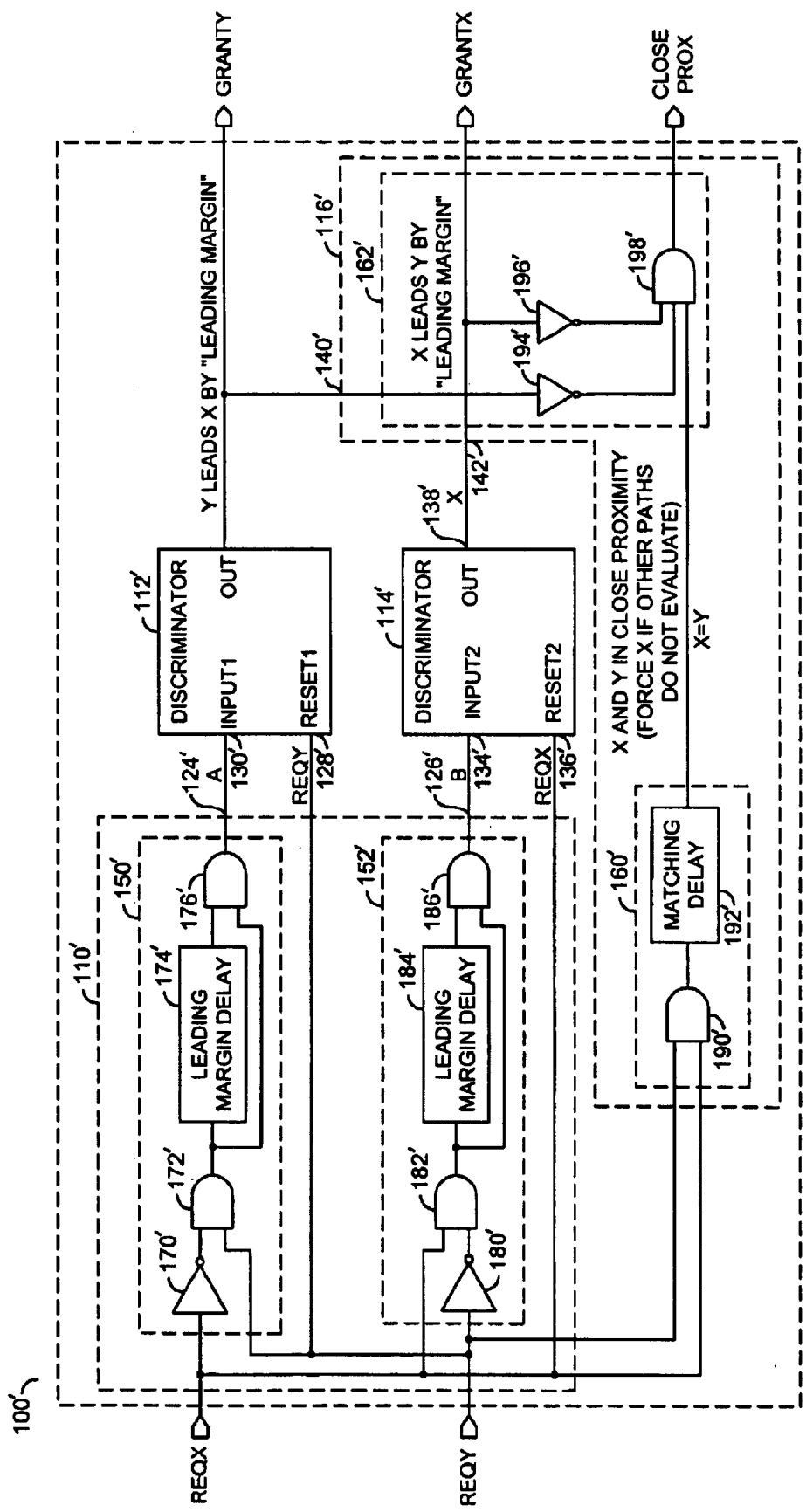
FIG. 7 is a diagram of an alternate embodiment of the present invention.

Referring to FIG. 7, an alternate embodiment 100' of the circuit 100 is shown. The circuit 100' may be similar to the circuit 100. However, the sense circuit 162' may also be configured to present a signal (e.g., CLOSE_PROX). The signal CLOSE_PROX may indicate a close proximity of the requests REQX and REQY. Additionally, the sense circuit 162' may have a reduced complexity (e.g., the gate 200 is removed from the alternate embodiment).

Figure 8:
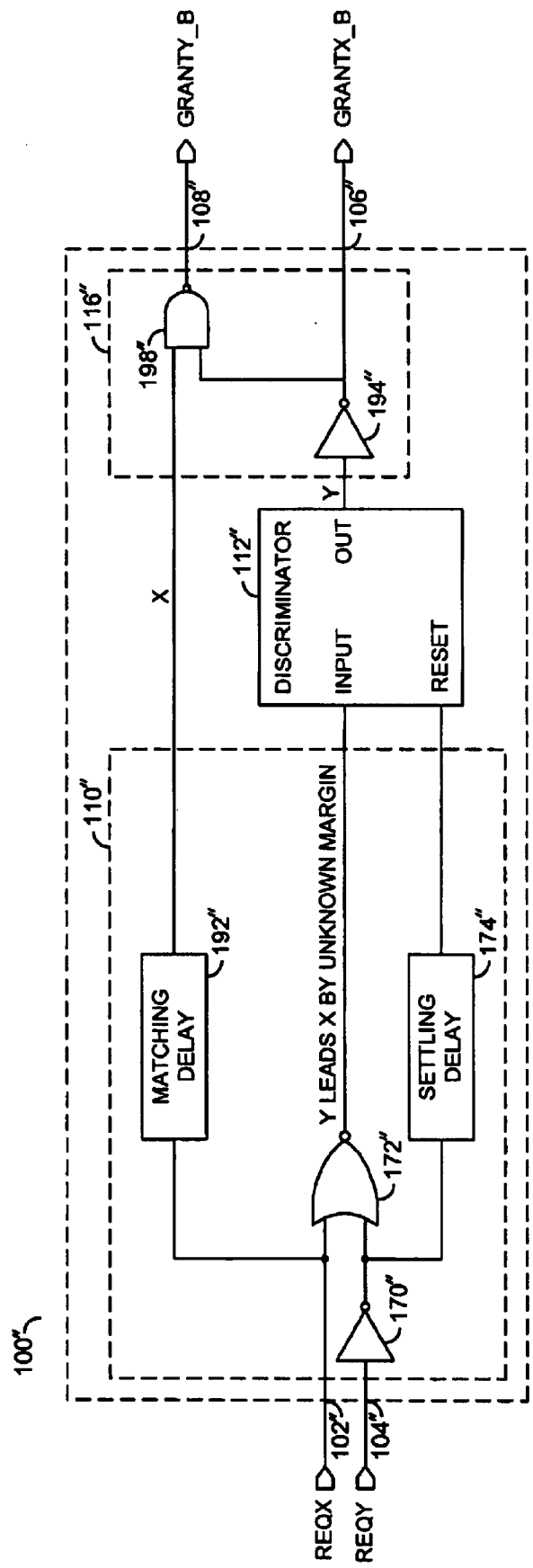
FIG. 8 is a diagram of another alternate embodiment of the present invention.

Referring to FIG. 8, another alternate embodiment 100" of the circuit 100 is shown. The circuit 100" may be similar to the circuit 100. The circuit 100" may be implemented in a simple form.

The signal REQY may be presented to the inverter 170". The inverter 170" may present an output to the gate 172" and the settling circuit 174". In one example, the gate 172" may be implemented as a NOR gate. However, other appropriate type gates may be implemented to meet particular design criteria. The signal REQX may be presented to the gate 172" and the matching delay 192". The gate 172" may present a signal to an input of the discriminator 112" and the settling delay 174" may present a signal to a reset of the discriminator 112". The discriminator 112" may present a signal (e.g., Y) in response to the gate 172" and the settling delay 174". The signal Y may be presented to the sense circuit 116". The matching delay 192" may also present the signal X to the sense circuit 116".

The sense circuit 116" may present the signals GRANTX_B and GRANTY_B in response to the signals X and Y. The signal Y may be presented to the inverter 194". The inverter 194" may present the signal GRANTY_B. The signal X may be presented to a first input of the gate 198" and the signal GRANTY_B may be presented to a second input of the gate 198". The gate 198" may be implemented as a NAND gate. However, other appropriate type gates may be implemented to meet a particular criteria. The gate 198" may present the signal GRANTX_B.

Figure 9:
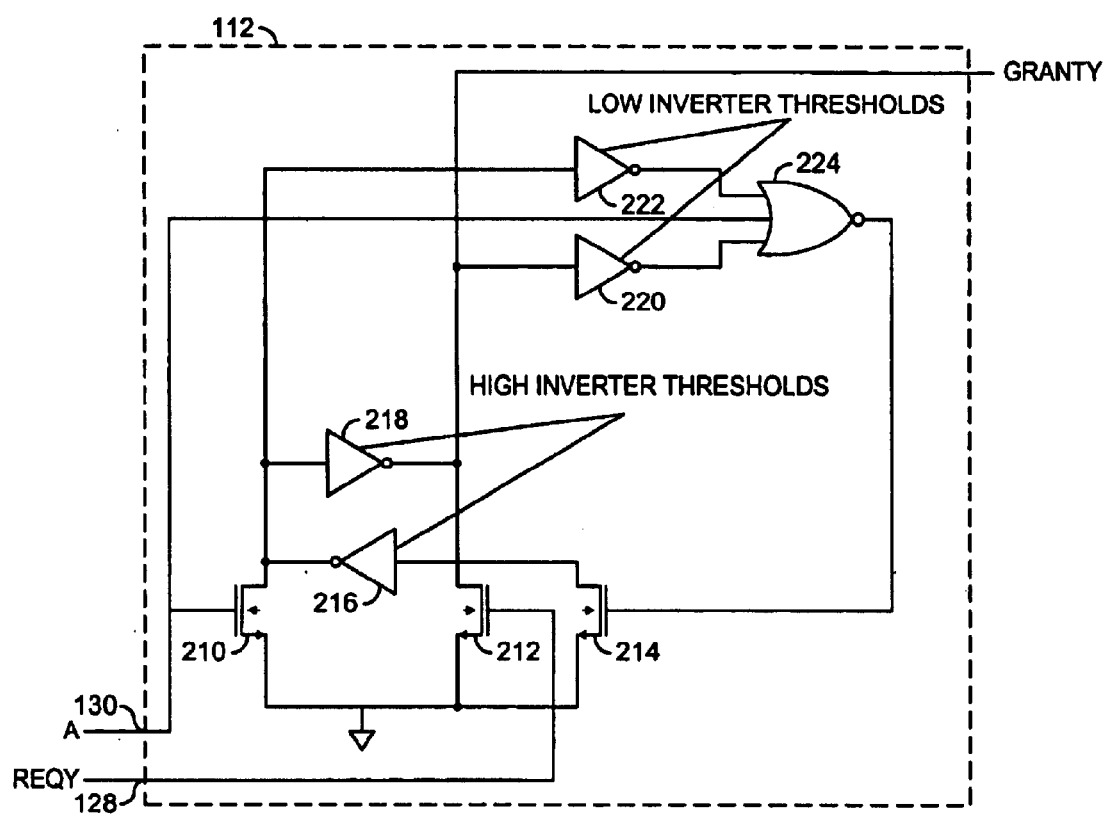
FIG. 9 is a block diagram of a discriminator of the present invention.

Referring to FIG. 9, a more detailed diagram of the discriminator circuit 112 is shown. Although a particular implementation of the discriminator 112 is shown, other appropriate architectures may be implemented. However, the discriminator 112 may be used to sense and conceal metastable events. The discriminator circuit 114 may be similar to the discriminator 112. The discriminator 112 generally comprises a transistor 210, a transistor 212, a transistor 214, an inverter 216, an inverter 218, an inverter 220, an inverter 222 and a gate 224. The gate 224 may be implemented as an NOR gate. The inverters 216 and 218 may be implemented as inverters with high thresholds. The inverters 220 and 222 my be implemented as inverters with low thresholds. The low threshold inverters 220 and 222 may be implemented to sense and conceal metastable events. Alternatively, the inverters 220 and 222 may be implemented as inverter inputs to the gate 224. The transistors 210, 212 and 214 may be implemented as CMOS transistors. However, other appropriate type transistors may be implemented to meet a particular criteria.

Alternatively, the circuits 100, 100' or 100" may implement delay devices on the request paths REQX and REQY. The delay devices may be optionally programmable. Optionally, a control signal may be presented to the sense logic circuit 116 to allow a user to select between forcing a first request (REQX) and a second request (REQY). In such a case, the sense logic circuit 116 may require additional components.

The circuit 100 may provide an arbitration circuit based on pulse discriminators (112 and 114) that may (i) reduce the 14 effects of metastable conditions, (ii) effect arbitration between two (or more) asynchronous requests, (iii) reduce delays associated with metastable events, and/or (iv) force a reset of a metastable condition.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a margin logic circuit connected to a plurality of inputs to receive a plurality of requests and configured to present one or more control signals;
    a first discriminator connected to said margin logic circuit to receive at least one of said control signals and configured to present a first grant access signal; and
    a sense circuit coupled to at least one of said inputs to receive at least one of said requests, connected to said first discriminator to receive said first grant access signal and configured to present a second grant access signal, wherein said first discriminator circuit is configured to reduce an effect of a metastable condition.

2. The apparatus according to claim 1, wherein said apparatus forms an arbitration circuit based on pulse discriminators.

3. The apparatus according to claim 1, wherein said requests comprise a plurality of asynchronous requests and said apparatus is further configured to arbitrate between said asynchronous requests.

4. The apparatus according to claim 1, wherein said first discriminator circuit is configured to reduce delays due to said metastable condition.

5. The apparatus according to claim 1, wherein said first discriminator circuit is further configured to sense and conceal said metastable condition.

6. The apparatus according to claim 1, wherein said margin logic circuit comprises:
    a first margin delay device connected to said inputs to receive said requests and configured to present at least one of said one or more control signals; and
    a second margin delay device connected to said inputs to receive said requests and configured to present at least another one of said one or more control signals.

7. The apparatus according to claim 6, wherein said first and said second margin delay devices each comprise (i) an inverter connected to one of said inputs, (ii) a first gate connected to said inverter and another of said inputs, (iii) a leading margin delay connected to said first gate and (iv) a second gate connected to said first rate and said leading margin delay.

8. The apparatus according to claim 1, wherein said sense circuit is further configured to sense when (i) a first of said requests leads a second of said requests, (ii) said second request leads said first request, and (iii) said first and said second requests are in close proximity in time.

9. The apparatus according to claim 8, wherein said sense circuit is further configured to sense when (i) said first request leads said second request by a first predetermined period of time and (ii) said second request leads said first request by a second predetermined period of time.

10. The apparatus according to claim 1, wherein said margin logic circuit comprises one or more delay elements on an input path of said requests.

11. The apparatus according to claim 10, wherein said one or more delay elements are programmable.

12. The apparatus according to claim 1, wherein said margin logic circuit comprises:
    an inverter connected to a first of said inputs to receive a first of said requests;
    a logic gate connected to (i) said inverter and (ii) a second of said inputs to receive a second of said requests and configured to present a first of said control signals;
    a first delay element connected to said second input to receive said second request and configured to present a second of said control signals; and
    a second delay element connected to said inverter and configured to present said first grant access signal.

13. The apparatus according to claim 1, wherein said sense circuit is connected to each of said inputs to receive each of said requests and configured to present a signal in response to said request being in close proximity to each other in time.

14. An apparatus comprising:

means for presenting one or more control signals in response to a plurality of requests from a plurality of inputs;

means for presenting a first grant access signal in response to at least one of said control signals connected to said means for presenting said control signals; and means for presenting a second grant access signal in response to (i) at least one of said requests and (ii) said first grant access signal, coupled to at least one of said inputs and connected to said means for presenting said first grant access signal, wherein said means for presenting said first grant access signal is configured to reduce an effect of a metastable condition.

15. A method for eliminating metastable events with an architecture based on discriminators, comprising the steps of:

(A) presenting one or more control signals in direct response to a plurality of requests;

(B) presenting a first grant access signal in direct response to at least one of said control signals;

(C) presenting a second grant access signal in (i) direct response to said first grant access signal and (ii) in response to at least one of said requests; and (D) reducing an effect of a metastable condition in presenting said first grant access signal.

16. The method according to claim 15, wherein said requests comprise a plurality of asynchronous requests.

17. The method according to claim 15, wherein step (D) comprises the step of:

reducing delays in presenting said first grant access signal due to said metastable condition.

18. The method according to claim 15, wherein step (C) further comprises the sub-step of:

presenting said second grant access signal in an asserted state if said metastable condition occurs.

19. The method according to claim 15, wherein step (C) comprises the sub-steps of:

determining if a first of said requests leads a second of said requests;

determining if said second request leads said first request; and determining if said first and second requests are in close proximity in time.

20. The method according to claim 19, wherein step (C) further comprises the sub-steps of:

determining if said first request leads said second request by a first predetermined period of time; and determining if said second request leads said first request by a second predetermined period of time.

21. The method according to claim 15, wherein presenting said first grant access signal is in further response to said requests.

22. The method according to claim 13, wherein presenting said second grant access signal is in further response to all of said requests.

* * * * *